United States Patent
Ismail et al.

(10) Patent No.: US 11,263,079 B2
(45) Date of Patent: Mar. 1, 2022

(54) ENDURANCE MODULATION FOR FLASH STORAGE

(71) Applicants: Kabushiki Kaisha Toshiba, Minato-ku (JP); Kioxia Corporation, Minato-ku (JP)

(72) Inventors: Amr Ismail, Bristol (GB); Magnus Stig Torsten Sandell, Bristol (GB)

(73) Assignees: Kabushiki Kaisha Toshiba, Minato-ku (JP); Kioxia Corporation, Minato-ku (JP)

(*) Notice: Subject to any disclaimer, the term of this patent is extended or adjusted under 35 U.S.C. 154(b) by 0 days.

(21) Appl. No.: 16/916,835

(22) Filed: Jun. 30, 2020

(65) Prior Publication Data
US 2021/0406118 A1  Dec. 30, 2021

(51) Int. Cl.
*G06F 11/10* (2006.01)
*H03M 13/45* (2006.01)

(52) U.S. Cl.
CPC ......... *G06F 11/1068* (2013.01); *H03M 13/45* (2013.01)

(58) Field of Classification Search
CPC .................................................. G06F 11/1068
USPC .................................. 714/764, 765, 762, 768
See application file for complete search history.

(56) References Cited

U.S. PATENT DOCUMENTS

| | | | |
|---|---|---|---|
| 6,469,931 B1 | 10/2002 | Ban et al. | |
| 8,245,099 B2 | 8/2012 | Lasser | |
| 9,450,612 B2* | 9/2016 | Hu | H03M 13/611 |
| 2004/0153679 A1* | 8/2004 | Fitton | G06F 1/3209 713/322 |
| 2008/0104312 A1 | 5/2008 | Lasser | |
| 2008/0291724 A1 | 11/2008 | Litsyn et al. | |
| 2011/0093652 A1 | 4/2011 | Sharon et al. | |
| 2013/0103891 A1 | 4/2013 | Sharon et al. | |
| 2014/0157087 A1* | 6/2014 | Yurzola | G11C 29/52 714/773 |
| 2018/0131394 A1* | 5/2018 | yokokura | H03M 13/152 |
| 2021/0157672 A1* | 5/2021 | Seol | G06F 11/1068 |

OTHER PUBLICATIONS

Bez, R. et al., "Introduction to Flash Memory," Proceedings of the IEEE, vol. 91, No. 4, Apr. 2003, doi: 10.1109/JPROC.2003.811702, pp. 489-502.

(Continued)

*Primary Examiner* — Fritz Alphonse
(74) *Attorney, Agent, or Firm* — Oblon, McClelland, Maier & Neustadt, L.L.P.

(57) ABSTRACT

A method for storing input data in a flash memory. The method comprising generating a codeword by encoding the input data with an error correcting code and generating a shaped codeword by applying a shaping function to at least a part of the codeword. The shaping function comprising logically inverting every n-th occurrence of a bit associated with a high-charge storage state in the part of the codeword. The method further comprising writing the shaped codeword to the flash memory, generating an estimated shaped codeword by reading the flash memory, generating soft decision information for the estimated shaped codeword, and retrieving the input data by decoding the soft decision information using an error correcting code soft decoder.

20 Claims, 10 Drawing Sheets

(56) References Cited

OTHER PUBLICATIONS

Jagmohan, A. et al., "Adaptive Endurance Coding for NAND Flash," IEEE Globecom 2010 Workshop on Application of Communication Theory to Emerging Memory Technologies, 2010, doi: 10.1109/GLOCOMW.2010.5700260, pp. 1841-1845.

Yaakobi, E. et al., "A Case for Biased Programming in Flash," 10th USENIX Workshop on Hot Topics in Storage and File Systems (HotStorage), 2018, 7 pages.

Sharon, E. et al., "Data Shaping for Improving Endurance and Reliability in Sub-20nm NAND," Flash Memory Summit, Aug. 2014, 24 pages.

* cited by examiner $j = 8$

ŝ | 0 | 1 | 0 | 1 | 1 | 1 | 1 | 0 | 1 | 0 | 1 | 1 | 0 |

š | 0 | 1 | 0 | 1 | 1 | 1 | 1 | 1 | 1 | 0 | 1 | 1 | 0 |

$\mathfrak{B}_{š}^{8}$

| 0 | 1 | 0 | 0 | 1 | 1 | 1 | 1 | 1 | 0 | 1 | 1 | 0 |
| 0 | 1 | 0 | 1 | 0 | 1 | 1 | 1 | 1 | 0 | 1 | 1 | 0 |
| 0 | 1 | 0 | 1 | 1 | 0 | 1 | 1 | 1 | 0 | 1 | 1 | 0 |
| 0 | 1 | 0 | 1 | 1 | 1 | 0 | 1 | 1 | 0 | 1 | 1 | 0 |
| 0 | 1 | 0 | 1 | 1 | 1 | 1 | 0 | 1 | 0 | 1 | 1 | 0 |

Fig. 9

ENDURANCE MODULATION FOR FLASH STORAGE

FIELD

Embodiments described herein relate generally to a method and apparatus for storing input data in a flash memory.

BACKGROUND

Data is generally stored in flash memories by trapping charges in a floating gate transistor. Writing a value to a flash memory cell (e.g. a floating gate transistor) generally involves progressively programming the flash memory cell by incrementally injecting electrons into the floating gate. This technique is often referred to as Incremental Step Pulse Programming (ISPP). During this process, the threshold voltage of the flash memory cell is continually sensed and charges are injected into the floating gate until it is determined that the threshold voltage of the flash memory cell exceeds the target value (e.g. the threshold voltage associated with the desired storage state). Incremental Step Pulse Programming (ISPP) only increases electric charges in the floating gate. As a result, before programming new data to a block of flash memory cells, the whole block has to be erased in order to remove the existing stored charges.

Repeated Program/Erase (P/E) cycles wear out flash memory cells, which can limit the device's usable lifetime. One reason for this is that the channel hot electron mechanism used to inject charges into the floating gate, and the Fowler-Nordheim tunneling mechanism used to erase charges from the floating gate, deteriorate the thin oxide layer of the flash memory cell, leading to charge trapping and retention errors. It has been found that the larger the charges being injected or erased, the faster the wear out rate of the flash memory cell. In light of this, there is a desire to reduce the proportion of cells programmed to high-charge storage states.

The process of modifying the input data to reduce the proportion of high-charge storage states is often referred to as data shaping. Conventional approaches to data shaping involve a non-negligible overhead, thereby incurring a rate loss, or require a map to translate the incoming data into shaped code words, thereby increasing complexity. In light of this, a new approach to data shaping in flash memories is required.

Arrangements will be understood and appreciated more fully from the following detailed description, made by way of example only and taken in conjunction with drawings in which:

FIG. 9 shows a graphical representation of determining an LLR value for an eighth index of the exemplary data vector according to an embodiment;

DETAILED DESCRIPTION

Figure 1:
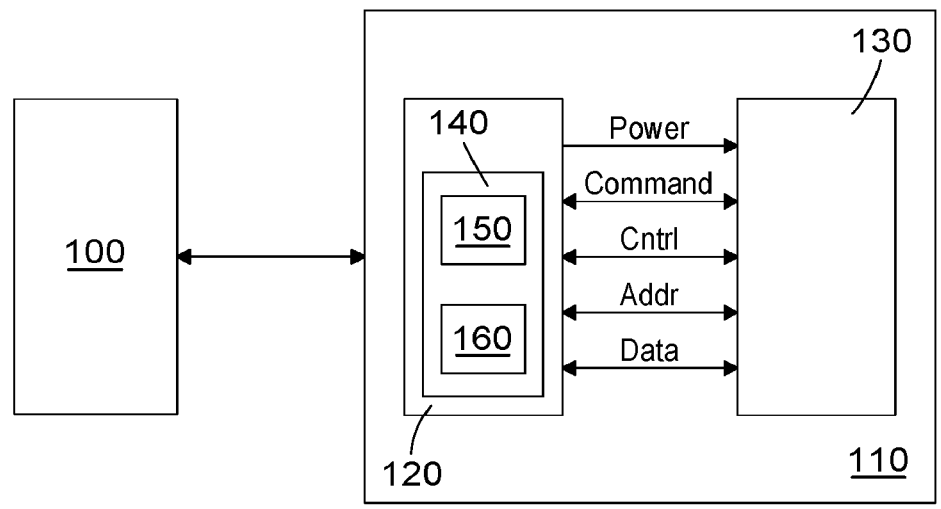
FIG. 1 shows a system that comprises a computing device and a non-volatile flash storage memory.

According to a first aspect there is provided a method for storing input data in a flash memory. The method comprising: generating a codeword by encoding the input data with an error correcting code; and generating a shaped codeword by applying a shaping function to at least a part of the codeword. The shaping function comprising logically inverting every n-th occurrence of a bit associated with a high-charge storage state in the part of the codeword. The method further comprising: writing the shaped codeword to the flash memory, generating an estimated shaped codeword by reading the flash memory, generating soft decision information for the estimated shaped codeword, and retrieving the input data by decoding the soft decision information using an error correcting code soft decoder.

In an embodiment, the error correcting code is a Low-Density Parity-Check (LDPC) code.

In an embodiment, only every n-th occurrence of a bit associated with a high-charge storage state in the part of the codeword is logically inverted. Optionally, every n-th occurrence comprises the n-th occurrence, 2n-th occurrence, 3n-th occurrence, 4n-th occurrence etc.

In an embodiment, writing the shaped codeword to the flash memory comprises writing the shaped codeword to a plurality of flash memory cells in the flash memory; and reading the flash memory comprises reading the plurality of flash memory cells to which the shaped codeword was written.

In an embodiment, the at least part of the codeword equals the whole codeword.

In an embodiment, n is greater than or equal to 2.

In an embodiment, the method further comprises receiving input data.

In an embodiment, generating the estimated shaped codeword comprises reading the flash memory using hard decision decoding.

In an embodiment, generating soft decision information for the estimated shaped codeword comprises generating a Log-Likelihood Ratio (LLR) value for a first bit in the estimated shaped codeword.

In an embodiment, generating the Log-Likelihood Ratio (LLR) value for the first bit in the estimated shaped codeword comprises: determining a first set of codewords that, when shaped by the shaping function, generate a shaped vector equal to the estimated shaped codeword and determining the Log-Likelihood Ratio (LLR) value for the first bit based on the number of codewords in the first set of codewords.

In an embodiment generating the Log-Likelihood Ratio (LLR) value for the first bit in the estimated shaped codeword comprises setting a modified codeword equal to the estimated shaped codeword with the first bit being logically inverted, determining a second set of codewords that, when shaped by the shaping function, generate the modified codeword; and determining the Log-Likelihood Ratio (LLR) value for the first bit based on: the number of codewords in the first set of codewords, divided by, the number of codewords in the second set of codewords.

In an embodiment, determining the Log-Likelihood Ratio (LLR) value for the first bit comprises summing a channel Log-Likelihood Ratio (LLR) associated with the first bit and a logarithm of the number of codewords in the first set of codewords, divided by, the number of codewords in the second set of codewords.

In an embodiment, the Log-Likelihood Ratio (LLR) value for the first bit is calculated according to:

$$L(j) = L_{ch}(j) + (-1)^{\hat{s}_j} \log \tfrac{|\mathfrak{I}_r|}{|\mathfrak{I}_{\hat{s}(j)}|}.$$

In an embodiment the method further comprises determining whether the modified codeword represents an invalid codeword; and in response to determining that the modified codeword does represent an invalid codeword; setting the Log-Likelihood Ratio (LLR) value for the first bit equal to a maximum Log-Likelihood Ratio (LLR) value.

In an embodiment, the maximum Log-Likelihood Ratio (LLR) value is an LLR value that indicates that the first bit in the estimated shaped codeword is certainly correct.

In an embodiment generating the Log-Likelihood Ratio (LLR) value for the first bit in the estimated shaped codeword comprises setting the Log-Likelihood Ratio (LLR) value equal to a channel Log-Likelihood Ratio (LLR) associated with the first bit in response to determining that the flash memory is at an early stage of its lifespan.

In an embodiment, the channel Log-Likelihood Ratio (LLR) associated with the first bit is equal to the Log-Likelihood Ratio (LLR) associated the flash memory cell in which the first bit is stored.

In an embodiment, the flash memory is at an early stage of its lifespan when a Raw Bit Error Raw (RBER) of the flash memory, or a plurality of flash memory cells in the flash memory, is below a predetermined threshold.

In an embodiment, generating the Log-Likelihood Ratio (LLR) value for the first bit in the estimated shaped codeword comprises identifying a set of indices in the estimated shaped codeword that could have been shaped by the shaping function; and in response to determining that the set of indices comprises the index of the first bit: setting the Log-Likelihood Ratio (LLR) values for the first bit based on the number of indices in the set of indices.

In an embodiment identifying the set of indices comprises: identifying an index, $1_r$, such that $C_{l_r}(\hat{s})\equiv 0$ (mod $(n_s-1)$) with $C_{l_r}(s)>0$, where $n_s$ is the shaping parameter, identifying a smallest value of $m_r$ such that $C_{l_r+m_r}(\hat{s})\equiv 1$ (mod $(n_s-1)$), and determining the set of indices according to $\mathfrak{I}_r = \{1_r+1, \ldots, 1_r+m_r-1\}$.

In an embodiment, the Log-Likelihood Ratio (LLR) values for the first bit is determined according to $L(j)\approx -\log(m_r-2)$.

In an embodiment, identifying the set of indices comprises: identifying an index, $1_r$, such that $C_{l_r}(\hat{s})\equiv 0$ (mod $(n_s-1)$) with $C_{l_r}(s)>0$, where $n_s$ is the shaping parameter, and determining the set of indices according to $\mathfrak{I}_r = \{1_r+1, \ldots, N\}$ with N denotes the size of estimated shaped codeword.

In an embodiment, generating the shaped codeword and writing the shaped code word to the flash memory is performed in response to determining that a Raw Bit Error rate of the flash memory is less than a predetermined threshold.

In an embodiment, the method further comprises interleaving the shaped codeword before writing to the flash memory; and deinterleaving when reading the flash memory to generate the estimated shaped codeword.

According to a second aspect, there is provided, a non-transitory computer readable storage medium comprising computer program instructions that, when executed by a processor, cause the processor to generate a codeword by encoding the input data with an error correcting code; and generate a shaped codeword by applying a shaping function to at least a part of the codeword. The shaping function comprising logically inverting every n-th occurrence of a bit associated with a high-charge storage state in the part of the codeword. The instructions further configured to cause the processor to: write the shaped codeword to the flash memory; generate an estimated shaped codeword by reading the flash memory; generate soft decision information for the estimated shaped codeword; and retrieve the input data by decoding the soft decision information using an error correcting code soft decoder.

According to a third aspect there is provided an apparatus for storing input data in a flash memory, the apparatus being configured to generate a codeword by encoding the input data with an error correcting code and generate a shaped codeword by applying a shaping function to at least a part of the codeword. The shaping function comprising logically inverting every n-th occurrence of a bit associated with a high-charge storage state in the part of the codeword. The apparatus further being configured to write the shaped codeword to the flash memory, generate an estimated shaped codeword by reading the flash memory, generate soft decision information for the estimated shaped codeword, and retrieve the input data by decoding the soft decision information using an error correcting code soft decoder.

In an embodiment, the apparatus is further configured to read the flash memory using hard decision decoding when generating the estimated shaped codeword.

In an embodiment, the apparatus is further configured to generate a Log-Likelihood Ratio (LLR) value for a first bit in the estimated shaped codeword when generating soft decision information for the estimated shaped codeword.

In an embodiment, the apparatus is further configured to: determine a first set of codewords that, when shaped by the shaping function, generate a shaped vector equal to the estimated shaped codeword, and determine the Log-Likelihood Ratio (LLR) value for the first bit based on the number of codewords in the first set of codewords; when generating the Log-Likelihood Ratio (LLR) value for the first bit in the estimated shaped codeword.

In an embodiment the apparatus is further configured to set a modified codeword equal to the estimated shaped codeword with the first bit being logically inverted; determine a second set of codewords that, when shaped by the shaping function, generate the modified codeword; and determine the Log-Likelihood Ratio (LLR) value for the first bit based on: the number of codewords in the first set of codewords, divided by, the number of codewords in the second set of codewords; when generating the Log-Likelihood Ratio (LLR) value for the first bit in the estimated shaped codeword.

In an embodiment the apparatus is further configured to: sum a channel Log-Likelihood Ratio (LLR) associated with the first bit and a logarithm of the number of codewords in the first set of codewords, divided by, the number of codewords in the second set of codewords, when determining the Log-Likelihood Ratio (LLR) value for the first bit.

In an embodiment, the apparatus is further configured to determine whether the modified codeword represents an invalid codeword; and in response to determining that the modified codeword does represent an invalid codeword; set the Log-Likelihood Ratio (LLR) value for the first bit equal to a maximum Log-Likelihood Ratio (LLR) value.

In an embodiment, the apparatus is further configured to set the Log-Likelihood Ratio (LLR) value equal to a channel Log-Likelihood Ratio (LLR) associated with the first bit in response to determining that the flash memory is at an early stage of its lifespan; when generating the Log-Likelihood Ratio (LLR) value for the first bit in the estimated shaped codeword.

In an embodiment the apparatus is further configured to identify a set of indices in the estimated shaped codeword that could have been shaped by the shaping function; and in response to determining that the set of indices comprises the index of the first bit: set the Log-Likelihood Ratio (LLR) values for the first bit based on the number of indices in the set of indices, when generating the Log-Likelihood Ratio (LLR) value for the first bit in the estimated shaped codeword.

In an embodiment, the apparatus is further configured to generate the shaped codeword and write the shaped code word to the flash memory in response to determining that a Raw Bit Error rate of the flash memory is less than a predetermined threshold.

According to a third aspect there is provided a flash memory comprising a plurality of flash memory cells and the apparatus for storing input data as described above.

FIG. 1 shows a system comprising a computing device 100 and non-volatile flash storage memory 110. The computing device 100 may be a mobile computing device, such as a mobile phone, tablet computer, laptop, camera or any other type of mobile computing device. Alternatively, the computing device 100 may be stationary, such as a desktop computer or indeed part of a stationary server or part of a storage bank, such as part of a RAID solution.

The non-volatile flash storage memory 110 may take any form of non-volatile storage device comprising flash memory. The non-volatile flash storage memory 110 may be a "thumb drive", a solid-state drive (SSD), a memory card, etc.

The computing device 100 and the non-volatile flash storage memory 110 are in communicative connection with each other in a manner that allows the computing device 100 to transmit data and commands to the non-volatile flash storage memory 110. The commands transmitted by the computing device 100 comprise instructions for the non-volatile flash storage memory 110 to store data transmitted by the computing device 100, and instructions to retrieve data from the non-volatile flash storage memory 110 and return this data to the computing device 100.

The computing device 100 may also provide power to the non-volatile flash storage memory 110. A number of interfaces that allow communication between a computing device 100 and a non-volatile flash storage memory 110 are known. The exact nature of the interface is not pertinent to the present disclosure. However, exemplary interfaces include the USB interface, SD, microSD, xD, Compactflash, MMC, to name but a few.

The non-volatile flash storage memory 110 comprises a memory controller 120 and a non-volatile flash memory 130. The memory controller 120 interfaces with the computing device 100 as well as with the flash memory 130. The memory controller 120 provides power to the flash memory 130 and is connected to the flash memory 130 via command, control, address and data lines. The memory controller 120 may control all of flash memory's operations.

The memory controller 120 comprises a control unit 140 that is configured to write data to the non-volatile flash memory 130 and read data from the non-volatile flash memory 130. The control unit 140 comprises a processor 150 and a memory 160. In FIG. 1 the processor 150 is communicatively coupled to the memory 160. The processor 150 is also communicatively coupled to the non-volatile flash memory 130 via the command, control, address and data lines. The memory 160 stores computer readable instructions that, when executed by the microprocessor 150, cause the microprocessor 150 to read and write data to and from the non-volatile flash memory 130 using the methods described herein.

Figure 2:
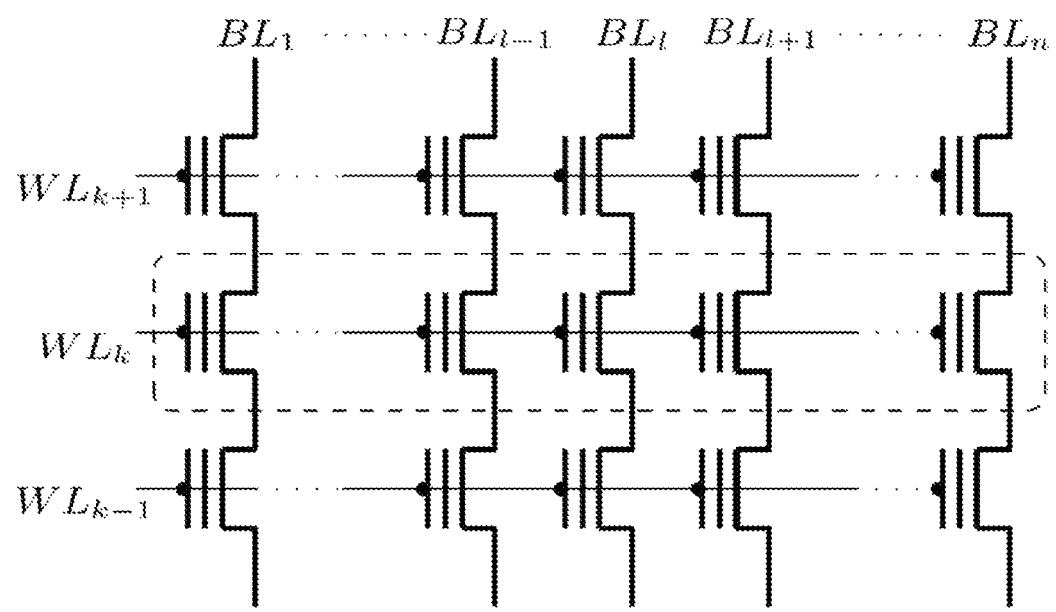
FIG. 2 shows an example architecture of memory cells within a flash memory array.

FIG. 2 shows an example architecture of memory cells within a flash memory array. The storage unit (or a cell) in flash memory is a floating gate transistor where data is stored in the form of trapped charge into the floating gate. As shown in FIG. 2, planar flash memories are organized into blocks of two-dimensional arrays of cells, each block is horizontally split into word-lines which can be accessed individually for read/write operations whereas memory erasures are applied blockwise. A word-line $WL_k$ to be read is first activated then a voltage is applied to the bit-line BL, and the source-drain current is sensed. A source-drain current indicates whether the threshold voltage is less than the applied gate voltage or not. The threshold voltage of the memory cell is determined by the amount of charge stored in the floating gate of the transistor.

Figure 3A:
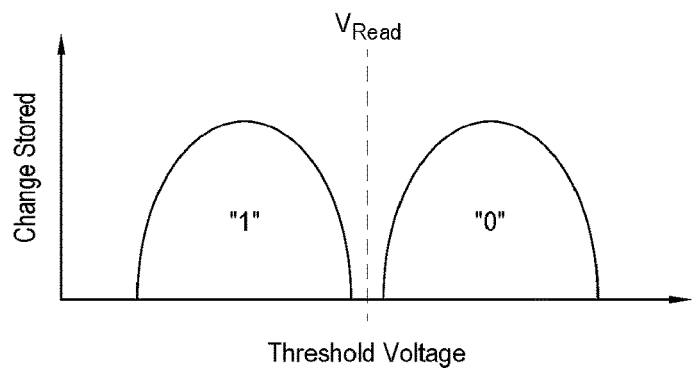
FIG. 3A shows the potential storage states of a Single-Level-Cell (SLC) flash memory.

FIG. 3A shows the potential storage states of a Single-Level-Cell (SLC) flash memory. When programming a memory cell an amount of charge is injected into the floating gate. When a memory cell is to be programmed to store a charge representative of a logical "1" the charge injected into the floating gate has to fall within the leftmost charge distribution shown in FIG. 3A. Conversely, when a memory cell is to be programmed to store a charge representative of a logical "0" the charge injected into the floating gate has to fall within the rightmost charge distribution shown in FIG. 3A.

To program a memory cell, the word-line $WL_k$ connected to the gate of the flash memory cell is progressively programmed via incremental step pulse program (ISPP). In doing so electrons are incrementally injected into the floating gate. As programming progresses the amount of charge stored in the memory cell is sensed and programming is stopped once the sensed charge falls within the desired charge distribution. In practice this means that the threshold voltage of the memory cell is determined in a sensing operation and programming is stopped once the threshold voltage has or exceeds an intended value.

As the electric charges can only be increased, the whole block needs to be erased prior to subsequent programming. The memory erasure, besides being time consuming, deteriorates the memory cells such that they become unusable after a number of program-erase (P/E) cycles. Repeated Program/Erase (P/E) cycles wear out the flash memory cells, thereby limiting the memory's lifetime. As discussed in the background section, the larger the injected/erased charge, the faster the wear out as can be seen in FIG. 3B.

Figure 3B:
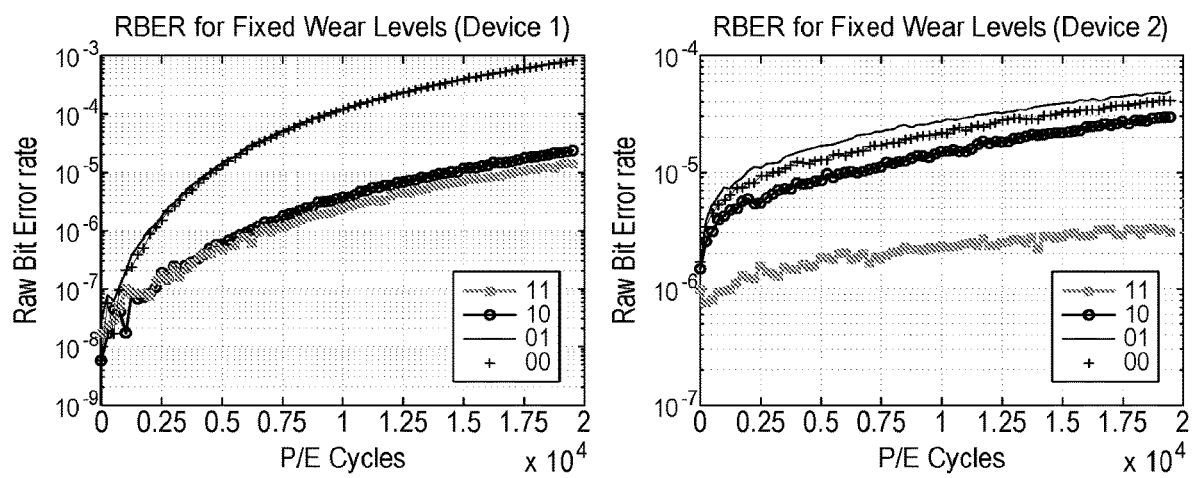
FIG. 3B shows the Raw Bit Error Rate (RBER) vs. Program/Erase (P/E) cycles for two flash memory devices.

FIG. 3B shows the Raw Bit Error Rate (RBER) vs. Program/Erase (P/E) cycles for two flash memory devices. FIG. 3B shows that the larger the injected/erased charge, the faster the wear out rate (or in other words the larger the Raw Bit Error Rate (RBER) for a given number of Program/Erase (P/E) cycles). The two devices shown in FIG. 3B are exemplary Multi-Level Cells (i.e. capable of storing two-bits of information per memory cell) and the largest injected/erased charge is associated with the data value '01'.

In light of this above, there is a desire to reduce the percentage of cells that are programmed to 'high' voltage levels, or in other words, the percentage of cells that inject a large charge into their floating gates. As discussed in the background section, "shaping" of the input data can be used to slow down the wear out rate. However, previous techniques have been associated with a rate loss and increased complexity.

In order to solve this problem, a novel, lossless, endurance modulation technique is disclosed herein that relies on the error correction code (ECC) to retrieve the original data. Error Correcting Codes (ECCs) are generally designed for data recovery in worst-case scenarios, in particular to keep devices operational in their late age. ECC capabilities are consequently under-used during much of the lifetime of a device and hence at the early age of the device the Error Correcting Codes (ECCs) can be jointly used to correct the few errors induced by the channel and for endurance demodulation.

More specifically, embodiments disclosed herein effectively introduce errors during the writing process by bit-flipping (i.e. logically inverting) high charge storage states. By reducing the percentage of cells with high charge storage states, the wear on the memory cell is reduced. Furthermore, while the number of channel errors is low (i.e. during the early age of the device) the bit flipped data can be recovered using the capabilities of the Error Correcting Code (ECC), thereby obtaining the original input data. As will become apparent, the complexity of the endurance modulation/demodulation scheme presented herein is negligible and causes no performance degradation as long as only few channel errors occur.

Figure 4A:
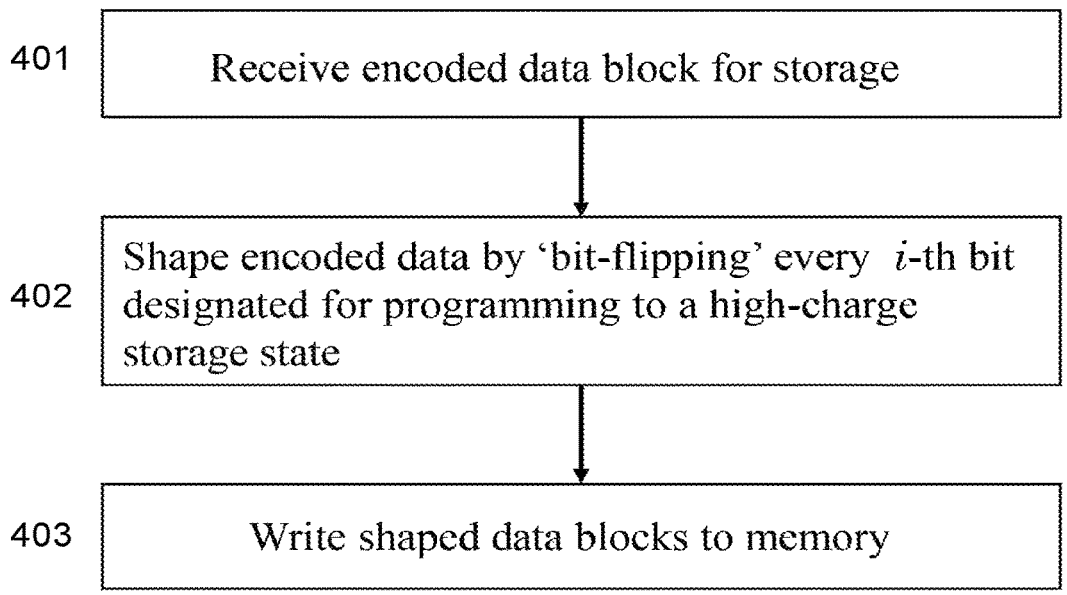
FIG. 4A shows a method of storing data in a flash memory according to an embodiment.

FIG. 4A shows a method of storing data in a flash memory according to an embodiment. The method begins in step 401 by receiving a block of data for storage in the flash memory. The block of data represents data values encoded using an error correcting code (ECC) (e.g. a Low-density parity-check code (LDPC)). In step 402 the input data is shaped by applying a shaping function, $\phi(x)$. The shaping function applied in step 402 comprises bit-flipping (i.e. logically inverting) every i-th bit designated for a high-charge storage state. In step 403 the shaped data is written to the non-volatile flash memory 130 for storage.

Figure 4B:
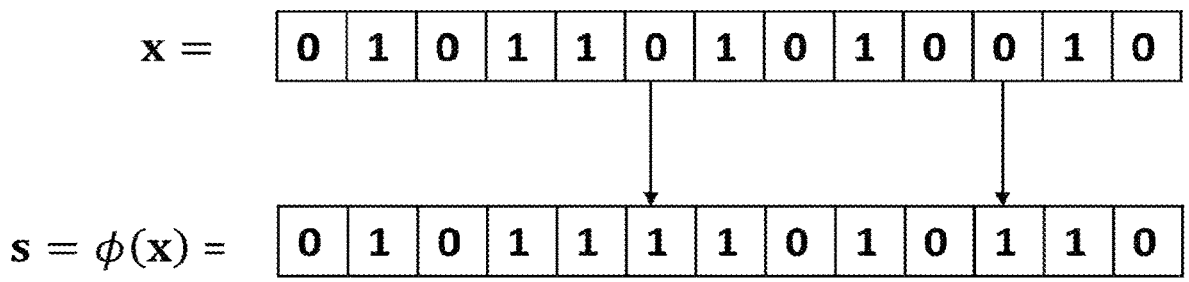
FIG. 4B shows an example of shaping a block of input data according to an embodiment.

FIG. 4B shows an example of shaping a block of input data according to an embodiment. FIG. 4B shows a block of input data, x, and a block of shaped data, s. The block of shaped data, s, is obtained by applying the shaping function, $\phi(x)$, to the input data, x, as described in step 402.

In FIG. 4B the input data, x, is being written to a logical page of a flash memory cell, such as that shown in FIG. 3, where a logical '0' is stored in a high charge storage state.

In FIG. 4B the shaping function, $\phi(x)$, reduces the percentage of cells to be programmed to the high charge storage state. The shaping function, $\phi(x)$, comprises bit-flipping (otherwise known as logically inverting) every $i^{th}$ bit that is to be stored in the high-charge storage state, in this case every $i^{th}$ '0' bit, where i≡0 (mod $n_s$) and $n_s$ is the shaping parameter. The shaping parameter, $n_s$, is a predetermined integer, that is greater than or equal to two.

In the example shown in FIG. 4B the shaping parameter, $n_s$, equals three (i.e. $n_s$=3) and the data value associated with the high-charge storage is a logical '0'. Consequently, the method in step 402 logically inverts every $3^{rd}$ '0' bit in the input data, x. In FIG. 4B this corresponds to the $3^{rd}$ '0' bit and the 6th '0' bit in the input data, x.

The input data shown in FIG. 4B represents the data to be stored in a logical page of a flash memory cell. For example, the input data could be programmed to the only logical page of a single-level cell (SLC) flash memory. Alternatively, the input data, x, may be stored on a single logical page of a flash memory comprising multiple logical pages, e.g. a flash memory comprising Multi-level Cells (MLC), Triple-Level Cells (TLC) or Quad Level Cells (QLC).

Where a flash memory comprises a plurality of logical pages, the method of shaping input data described in FIG. 4A and FIG. 4B is performed for the data written to each logical page. For instance, in a MLC (2 bits/cell) flash memory, the MSB and LSB pages can be independently endurance modulated to provide the desired endurance gain.

Figure 5:
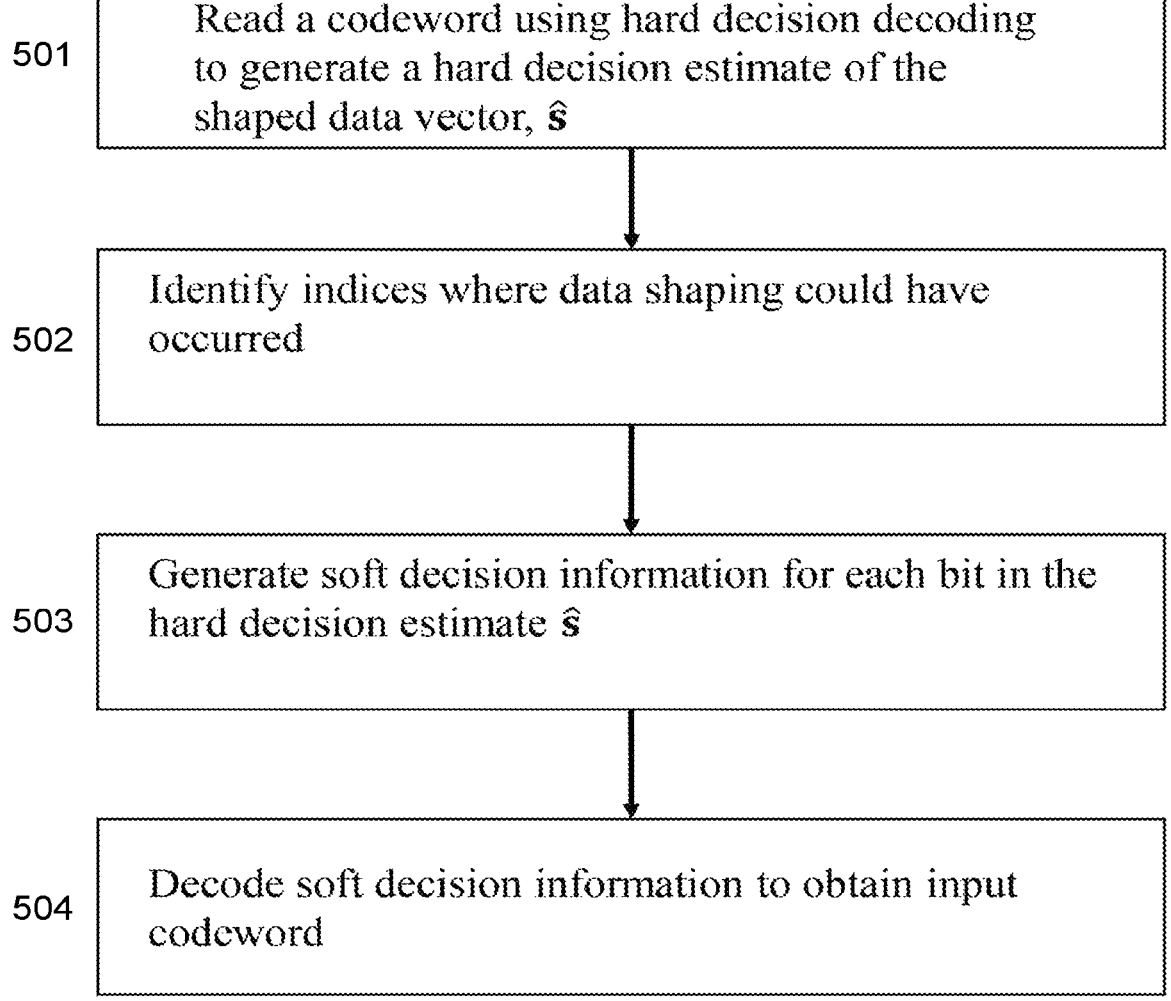
FIG. 5 shows a method of reading data from a flash memory according to an embodiment.

FIG. 5 shows a method of reading data from a flash memory according to an embodiment. The method begins in step 501 by reading a codeword (i.e. a block of data) from a plurality of flash memory cells using hard decision decoding, thereby generating a hard decision estimate of the shaped data vector, S. Upon reading, the location (or locations) of the flipped bit (or bits) within the hard decision estimate of the shaped data vector, ŝ, are unknown to the controller.

In step 502 the method identifies the indices in the hard decision estimate of the shaped data vector, ŝ, where data shaping (i.e. bit flipping the $i^{th}$ bit associated with the high charge storage state) could have occurred.

Determining the possible locations of the flipped bits, $\mathfrak{I}$, will be described with reference to an example where the data value '0' is associated with the high-charge storage state. However, for the avoidance of doubt it is noted that the method could equally be used when the high-charge storage state is associated with a data value of '1'.

Let $C_k(\hat{s})$ denote the number of data values associated with the high-charge storage state in the first k entries of the hard decision estimate of the shaped data vector, ŝ. In step 502 the method determines a set of indices, $l_r$, such that $C_{l_r}(\hat{s}) \equiv 0 \pmod{n_s-1}$ with $C_{l_r}(\hat{s}) > 0$, where $n_s$ is the shaping parameter.

Next, for each index in the set of indices, $l_r$, the method finds a smallest value of in, such that $C_{l_r+m_r}(\hat{s}) \equiv 1 \pmod{n_s-1}$. For each $l_r$ and associated $m_r$, the method generates a range of the possible indices of the $r^{th}$ flipped bit according to: $\mathfrak{I}_r = \{l_r+1, \ldots, l_r+m_r-1\}$.

In the case where no $m_r$ value can be found for a corresponding $l_r$, the range of possible indices of the $r^{th}$ flipped bit becomes $\{l_r+1, \ldots, N\}$ with N denotes the size of the input vector, which is equal to the size of the hard decision estimate of the shaped data vector, ŝ.

Once the method has determined the range of possible indices for each flipped bit, the method forms the possible locations of flipped bits, $\mathfrak{I}$, according to:

$$\mathfrak{I} = \bigcup_r \mathfrak{I}_r$$

In step 503 the method generates and assigns soft information to each bit of the hard decision estimate in order to allow the error correcting code (ECC) soft decoder to recover the original input codeword. In an embodiment, the soft information for each bit of the hard decision estimate is a log-likelihood ratio (LLR).

In an embodiment, the log-likelihood ratios (LLRs) are determined as follows, where s is the hard decision estimate of the shaped data vector s, v is a vector of quantized read threshold voltages, b is a stream of equally likely bits, and φ(b) is the shaped version of b (i.e. after the shaping function has been applied to b). The log-likelihood ratio for the j-th bit in the hard decision estimate of the shaped vector (i.e. ŝ) is defined as:

$$L(j) \triangleq \log\left(\frac{\mathbb{P}(b_j=0|v)}{\mathbb{P}(b_j=1|v)}\right) = \log\left(\frac{\sum_{b|b_j=0}\mathbb{P}(b|v)}{\sum_{b|b_j=1}\mathbb{P}(b|v)}\right).$$

The posterior probability of b can be expressed as:

$$P(b|v) = \mathbb{P}(b;\phi(b)|v)$$
$$= \mathbb{P}(b|\phi(b),v)\mathbb{P}(\phi(b)|v)$$
$$= \mathbb{P}(b|\phi(b))\mathbb{P}(\phi(b)|v)$$

where the last equality follows from the fact that b, φ(b), v form a Markov chain. The max-log LLR is then given by:

$$L(j) \approx \log\left(\frac{\max_{\phi(b)|b_j=0}\left\{\mathbb{P}(\phi(b)|v)\sum_{b|b_j=0}\mathbb{P}(b|\phi(b))\right\}}{\max_{\phi(b)|b_j=1}\left\{\mathbb{P}(\phi(b)|v)\sum_{b|b_j=1}\mathbb{P}(b|\phi(b))\right\}}\right).$$

In the following, we assume that the hard decision estimate of the shaped data vector, ŝ, is a legitimate codeword, that is to say that the data vector ŝ does not contain $n_s$ consecutive instances of the data value corresponding to the high-charge storage state.

If $j \in \Im$, or in other words, if the index of the hard decision estimate of the shaped data vector, š, belongs to the set of locations of possible flipped bits, then the denominator and nominator of the above equation are dominated by the hard-decision estimate ŝ of the shaped vector, consequently the max-log approximation for those bits reduces to:

$$L(j) \approx \log\left(\frac{\sum_{b|b_j=0}\mathbb{P}(b|\phi(b)=\hat{s})}{\sum_{b|b_j=1}\mathbb{P}(b|\phi(b)=\hat{s})}\right).$$

As b consists of equally likely bits, one has for each $j \in \Im_r$:

$$L(j) \approx -\log(m_r-2), j=l_r+1,\ldots,l_r+m_r-1.$$

If no such $m_r$ exists, the LLR for the j-th bit becomes:

$$L(j) \approx -\log(N-l_r), j=l_r+1,\ldots,N.$$

For each $j \notin \Im$ a modified shaped vectors that is identical to the shaped vector ŝ except at the j-th position is defined. That is to say the modified shaped vector š is identical to the shaped vector ŝ at all bit positions, apart from the j-th position where the value in the shaped vector ŝ is logically inverted. In this case, the max-log LLR becomes:

$$L(j) \approx (-1)^{\hat{s}_j}\log\left(\frac{\mathbb{P}(\phi(b)=\hat{s}|v)\sum_{b|b_j=\hat{s}_j}\mathbb{P}(b|\phi(b)=\hat{s})}{\mathbb{P}(\phi(b)=\check{s}|v)\sum_{b|b_j=\check{s}_j}\mathbb{P}(b|\phi(b)=\check{s})}\right)$$

$$\stackrel{(a)}{=} (-1)^{\hat{s}_j}\log\left(\frac{\mathbb{P}(v|\hat{s})\sum_{b|b_j=\hat{s}_j}\mathbb{P}(b;\hat{s})}{\mathbb{P}(v|\check{s})\sum_{b|b_j=\check{s}_j}\mathbb{P}(b;\check{s})}\right)$$

$$\stackrel{(b)}{=} (-1)^{\hat{s}_j}\log\left(\frac{\prod_k \mathbb{P}(v_k|\hat{s}_k)\sum_{b|b_j=\hat{s}_j}\mathbb{P}(b;\hat{s})}{\prod_k \mathbb{P}(v_k|\check{s}_k)\sum_{b|b_j=\check{s}_j}\mathbb{P}(b;\check{s})}\right)$$

$$\approx L_{ch}(j) + (-1)^{\hat{s}_j}\log\left(\frac{\sum_{b|b_j=\hat{s}_j}\mathbb{P}(b;\hat{s})}{\sum_{b|b_j=\check{s}_j}\mathbb{P}(b;\check{s})}\right)$$

$$= L_{ch}(j) + (-1)^{\hat{s}_j}\log(\tfrac{|\mathfrak{B}_{\hat{s}}^j|}{|\mathfrak{B}_{\check{s}}^j|})$$

where $L_{ch}(j)$ is the channel LLR for the j-th bit and:

$$|\mathfrak{B}_{\hat{s}}^j| \triangleq \{b:b_j=\hat{s}_j,\phi(b)=\hat{s}\}.$$

In the derivation above, (a) follows from Bayes' rule, whereas (b) follows from the independence of the flash channel realizations experienced by the different cells.

The above equations are used in step 503 to generate soft information for each bit in the hard decision estimate of the shaped data vector, ŝ.

Figure 6:
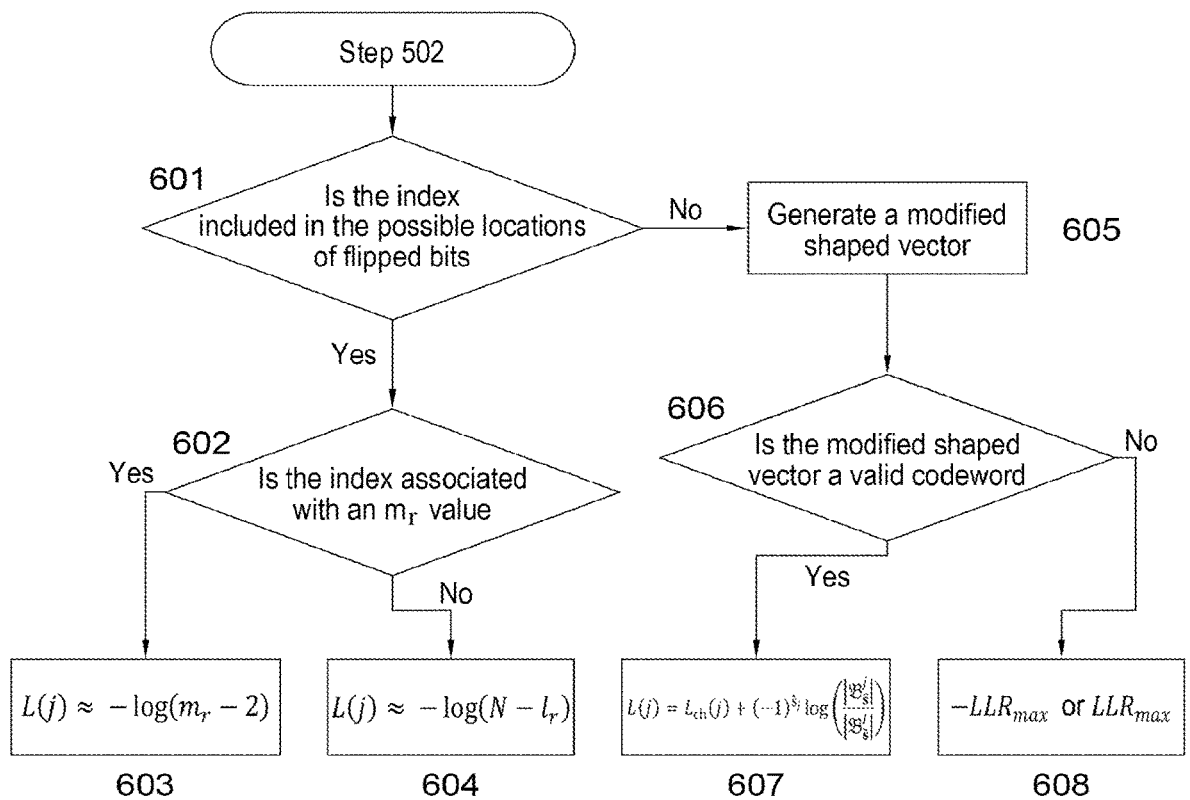
FIG. 6 shows a method of calculating an LLR value for the j-th bit of a data vector according to an embodiment.

FIG. 6 shows a method of calculating an LLR value for the j-th bit of a data vector according to an embodiment. In step 601 the method determines whether the index j of the data vector is included in the possible locations of flipped bits, $\Im$.

As discussed above, the range of the possible indices of the $r^{th}$ flipped bit, $\Im_r$, is generated differently depending on whether an $m_r$ value exists for the $r^{th}$ flipped bit. If it is determined in step 601 that the index j is included in the possible locations of flipped bits, $\Im$, it is then determined, in step 602, whether the range of possible indices of the $r^{th}$ flipped bit, $\Im_r$, in which the index j can be found, has an $m_r$ value associated with it.

If it is determined in step 602 that the index j is associated with a range of possible indices of the $r^{th}$ flipped bit, $\Im_r$, that has an $m_r$ value then the LLR is calculated in step 603 according to $L(j) \approx -\log(m_r-2)$.

If it is determined in 602 that the index j is associated with a range of possible indices of the $r^{th}$ flipped bit, $\Im_r$, that is not associated with an $m_r$ (i.e. the end index of the range was generated using N, the size of the input vector, rather than $m_r$) then the LLR is calculated in step 604 according to $L(j) \approx -\log(N-l_r)$, where $l_r$ is the start index associated with the set $\Im_r$.

If in step 601 it is determined that the index j of the data vector is not included in the possible locations of flipped bits, $\Im$, then the method subsequently generates a modified shaped vector, š, in step 605 and then determines in step 606 whether the modified shaped vector, š, is a valid codeword. The modified shaped vector, š, is not a valid codeword if it contains $n_s$ consecutive instances of the data value corresponding to the high-charge/high threshold voltage storage state.

If in step 606 it is determined that the modified shaped vector, š, is a valid codeword, then the LLR value of the j-th bit of the data vector is calculated in step 607 according to:

$$L(j) = L_{ch}(j) + (-1)^{\hat{s}_j} \log \tfrac{|\mathcal{B}_{\hat{s}}^j|}{|\mathcal{B}_{\check{s}}^j|}$$

where $L_{ch}(j)$ is the channel LLR for the j-th bit and $$\left|\mathcal{B}_{\hat{s}}^j\right| \triangleq \{b: b_j = \hat{s}_j, \phi(b) = \hat{s}\}.$$

As known in the art, the channel LLR for the j-th bit can be calculated offline. In this case the flash memory controller (e.g. controller 120) programs the flash memory 130 with a known sequence. The controller subsequently reads the flash memory and determines the channel LLR values based on the difference between the original sequence written to the flash memory and the output sequence read from the flash memory. The controller repeats this calculation at different circumstances in order to account for device aging and other forms of distortion (e.g. retention noise, read disturb errors etc.). The estimated channel LLR's are stored by the controller in a look up table, optionally within memory 160. These values are subsequently retrieved by the controller when LLR values are determined for each read bit as described above.

If it is determined in step 606 that the modified shaped vector, š, is not a valid codeword, then step 608 comprises setting the LLR value of the j-th bit of the data vector equal to the maximum allowable LLR magnitude for that data value (i.e. $-LLR_{max}$ or $LLR_{max}$).

Although in FIG. 6 the method of generating an LLR value for the j-th bit of a data vector is shown as a consecutive series of steps, it will be appreciated that the order of the decisions could be changed, provided the same output (i.e. LLR value) is obtained for the applicable index of the hard decision estimate, ŝ.

Returning to FIG. 5, after generating soft information for each bit in the hard decision estimate of the shaped vector, ŝ, the soft decision information is inputted to an error correcting code (ECC) soft decoder in step 504 where the original input codeword is obtained.

During the early age of a flash memory device the magnitude of the LLR associated with the channel, $|L_{ch}|$, is much greater than one (i.e. $|L_{ch}| \gg 1$). Consequently, in an embodiment, step 607 of FIG. 6 comprises setting the LLR value equal to the LLR of the channel, $L_{ch}$.

This simplified calculation is used at the early age of the device. The device is determined to be at an early stage in its life if the Raw Bit Error Rate (RBER) is below a predetermined threshold. In an embodiment the Raw Bit Error Rate (RBER) of the memory is tracked by the controller over the device's life span. In order to determine the Raw Bit Error Rate (RBER) the controller compares the read sequence of bits with the recovered sequence of bits (i.e. after decoding). At the beginning of its life, the memory channel introduces only a few errors and the controller can recover the original sequence. In this case a low Raw Bit Error Rate (RBER) is obtained since the read sequence of bits matches or is substantially similar to the recovered sequence of bits. In an embodiment, the Raw Bit Error Rate (RBER) is recalculated each time the controller retrieves data from the flash memory.

Once this approximation is no longer valid (i.e. when the device is not at an early age), step 607 uses the full equation discussed above when $j \notin \mathfrak{J}$.

The method described in relation to FIGS. 5 and 6 will now be described in relation to a non-limiting example where the input codeword corresponds to the input data, x, shown in FIG. 4B, the data written to the flash memory corresponds to the shaped data, s, and the shaping parameter, $n_s$, equals three (i.e. $n_s=3$).

Figure 7:
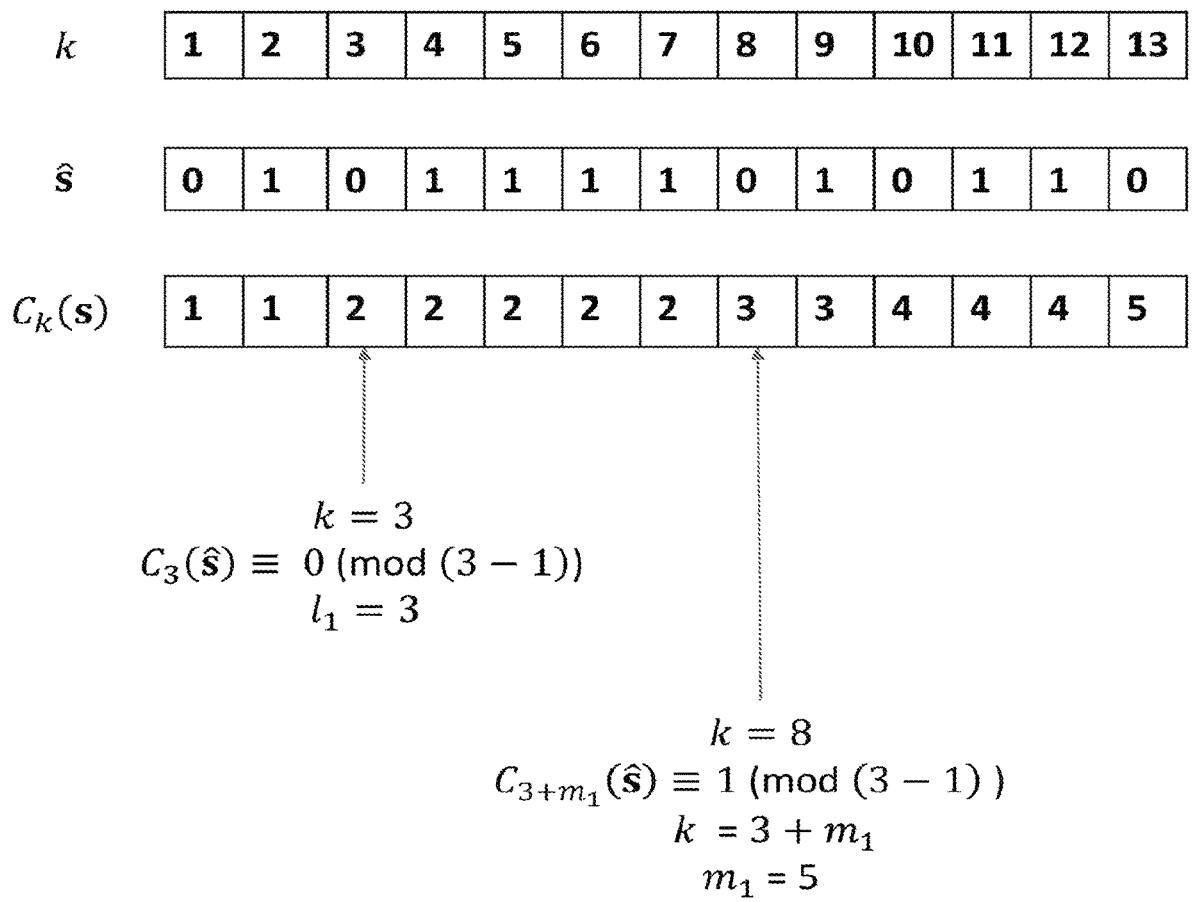
FIG. 7 shows a graphical representation of determining the indices where data shaping could have taken place according to an embodiment.

FIG. 7 shows a graphical representation of determining the indices where data shaping could have taken place according to an embodiment. FIG. 7 shows a first vector indicating the number of values, k, at each point in the data vectors. FIG. 7 also shows the hard decision estimate of the shaped data vector, s, and a vector indicating values of $C_k(\hat{s})$ for each index k in the shaped data vector, ŝ.

As discussed above, the function $C_k(\hat{s})$ denote the number of data values associated with the high-charge/high threshold voltage storage state in the first k entries of the hard decision estimate of the shaped data vector, ŝ. In this example the data value associated with the high-charge storage state is logical '0'. Consequently $C_k(\hat{s})$ denotes the number of zeros ('0's) in the first k entries of the hard decision estimate of the shaped data vector, ŝ.

The equality $C_{l_r}(s) \equiv 0 \pmod{(n_s-1)}$ if first satisfied when k=3, consequently the first l value, $l_1$, equals three (i.e. $l_1=3$). After determining the start index of the possible flipped bits (i.e. $l_1$) the method determines a length of the possible flipped bits (i.e. $m_1$).

Where $l_1$ equals three (i.e. $l_1=3$), the first time that the equation $C_{3+m_1}(\hat{s}) \not\equiv 0 \pmod{(3-1)}$ is satisfied is when k=8, consequently the first m value, $m_1$, equals five (i.e. $m_1=5$).

The method subsequently generates a range of the possible indices of the $1^{st}$ flipped bit, $\mathfrak{J}_1$. As discussed above, because the start index $l_1$ has an associated length value $m_1$, the range of possible indices of the $1^{st}$ flipped bit is generated according to: $\mathfrak{J}_1 = \{l_1+1, \ldots, l_1+m_1-1\} = \{4, 5, 6, 7\}$.

The next entry in the hard decision estimate of the shaped data vector, ŝ, where $C_{l_r}(\hat{s}) \equiv 0 \pmod{(n_s-1)}$ is satisfied is when k=10. Consequently, $l_2$, equals ten (i.e. $l_2=10$). When k=10 the first time that the equation $C_{10+m_2}(\hat{s}) \not\equiv 0 \pmod{(3-1)}$ is satisfied is at k=13, in this case $m_2$, equals three (i.e. $m_2=3$). Since the index $l_2$ has a length, $m_2$, associated with it, the range of the possible indices of the $2^{nd}$ flipped bit, $\mathfrak{J}_2$, is calculated according to: $\mathfrak{J}_2 = \{l_2+1, \ldots, l_2+m_2-1\} = \{11, 12\}$.

In the example shown in FIG. 7 the possible locations of flipped bits, $\mathfrak{J}$, equals $\{4, 5, 6, 7\}$ and $\{11, 12\}$. The LLR for each bit in the range of possible indices of the $1^{st}$ flipped bit, $\mathfrak{J}_1$, is given by $L(j) \approx -\log(m_1-2), j=l_1+1, \ldots, l_1+m_1-1$, consequently $L(j) \approx -\log(3)$, for j=4, 5, 6, 7. Likewise, the LLR for each bit in the range of possible indices of the $2^{nd}$ flipped bit, $\mathfrak{J}_2$, is given by $L(j) \approx -\log(m_2-2), j=l_2+1, \ldots, l_2+m_2-1$, consequently $L(j) \approx 0$, j=11, 12.

In the example of FIG. 7 the hard decision estimate of the shaped data vector, ŝ, has two flipped bits (i.e. r=1, 2). The $1^{st}$ flipped bit is located at one of indices 4, 5, 6 or 7, of the shaped data vector, ŝ, whilst the $2^{nd}$ flipped bit is located at one of indices 11 or 12. Consequently there are eight possible codewords whose shaped vector equals the hard decision estimate of the shaped data vector, ŝ, shown in FIG. 7. The number of codewords whose shaped vector equals the hard decision estimate of the shaped data vector, ŝ, can be determined by multiplying the number of indices in each range of possible indices, $\mathfrak{I}_r$, (i.e. 4×2).

Turning now to the indices that do not belong to the range of possible flipped bit locations (i.e. when $j \notin \mathfrak{I}$). In the example of FIG. 7 this includes when j, the index value, equals 1, 2, 3, 8, 9, 10, 13.

Figure 8A:
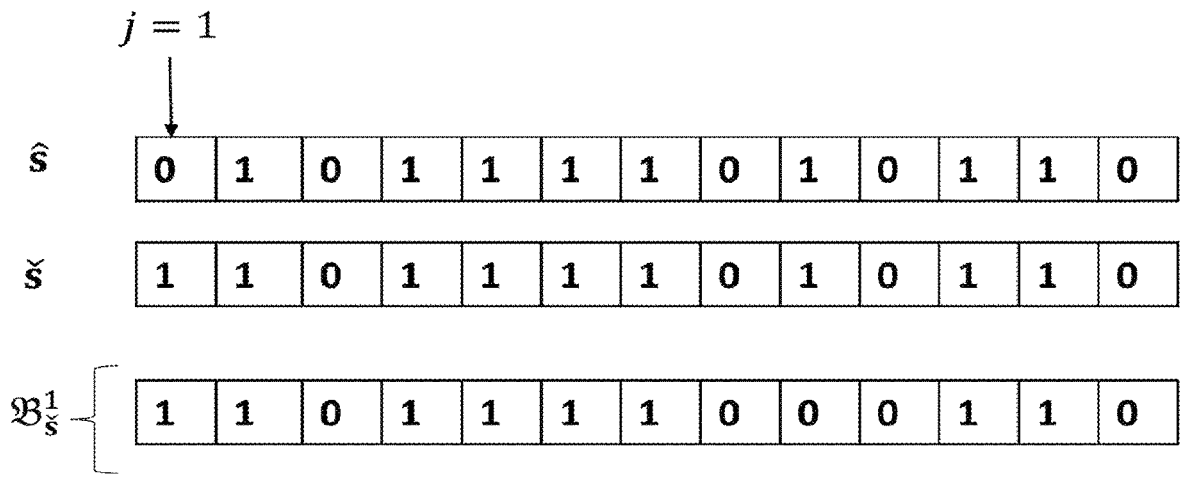
FIG. 8A shows a graphical representation of determining an LLR value for a first index of the exemplary data vector according to an embodiment.

FIG. 8A shows a graphical representation of determining an LLR value for a first index of the exemplary data vector according to an embodiment. FIG. 8A shows the hard decision estimate of the shaped data vector, ŝ. The graphical representation in FIG. 8A is used to explain how the LLR value of the first index (i.e. j=1) is generated. For j=1, the modified shaped vector, š, is defined to be identical to ŝ expect at the $1^{st}$ bit position where the data value is logically inverted. Consequently the modified shaped vector, š, has a data value of '1' at j=1 (as opposed to the hard decision estimate of the shaped data vector, ŝ, which has a data value of '0' at j=1).

Using the modified shaped vector, š, the method determines the number of valid codewords that, once shaped using the shaping function, would result in the modified shaped vector, š. The set of possible codewords whose shaped vector is given by š is denoted by $\mathfrak{B}_š^1$ (when j=1). As shown in FIG. 8A, there is only one unique codeword whose shaped vector is denoted by the modified shaped vector, š. The unique codeword being b=(1,1,0,1,1,1,1,0,0,0,1,1,0). As a result the size of the set of possible code words, $|\mathfrak{B}_š^j|$, equals 1 (i.e. $|\mathfrak{B}_š^j|$=1). As discussed above, the size of the set of possible code words whose shaped vector equals the hard decision estimate of the shaped data vector, ŝ (i.e. $|\mathfrak{B}_ŝ^j|$) equals 8 (i.e. $|\mathfrak{B}_ŝ^j|$=8).

Based on these values the LLR value for the index j=1 of the shaped data vector, ŝ, is calculated according to:

$$L(j) = L_{ch}(j) + (-1)^{š_j} \log\left(\frac{|\mathfrak{B}_ŝ|}{|\mathfrak{B}_š|}\right)$$

$$L(1) = L_{ch}(1) + (-1)^0 \log\left(\frac{8}{1}\right)$$

$$L(1) = L_{ch}(1) + \log(8)$$

where log(n) is the natural logarithm (i.e. to the base of the mathematical constant e).

Figure 8B:
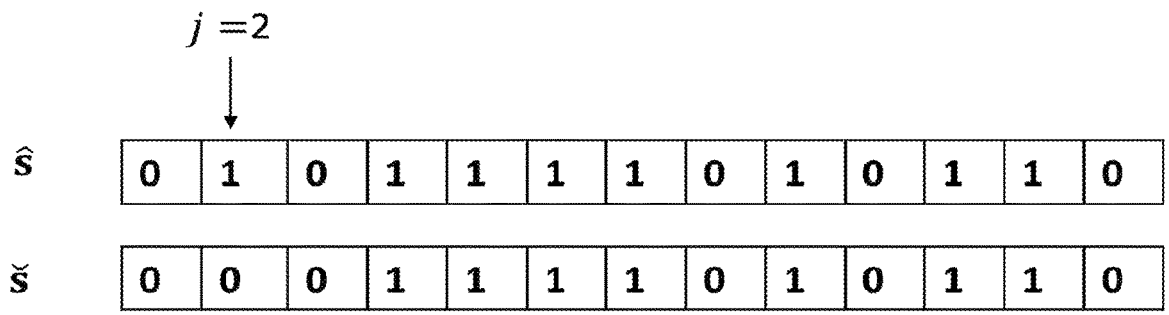
FIG. 8B shows a graphical representation of determining an LLR value for a second index of the exemplary data vector according to an embodiment.

FIG. 8B shows a graphical representation of determining an LLR value for a second index of the exemplary data vector according to an embodiment. FIG. 8B shows the hard decision estimate of the shaped data vector, ŝ. For j=2, the modified shaped vector, š, is defined to be identical to ŝ expect at the $2^{nd}$ position where the data value is logically inverted. Consequently the modified shaped vector, š, has a data value of '0' at j=2 (as opposed to the hard decision estimate of the shaped data vector, ŝ, which has a data value of '1' at j=2).

The resulting modified shaped vector, š, shown in FIG. 8B comprises three consecutive zeros at indexes j=1, 2, 3. Having three consecutive zeros means the codeword is not valid ($\mathfrak{B}_š^2$=∅). This is because it is not possible to obtain a number of successive high charge storage states equal to the shaping parameter, $n_s$, (which is 3 in this example) after an input vector has been shaped (since this would have been modified by the shaping function). Consequently, any valid code word will differ from ŝ in more than one location. In this case, the LLR is approximated as: L(2)≈−$L_{max}$, where $L_{max}$ is the maximum allowable LLR magnitude and the negative LLR values are associated with the data value '1'.

For j=3 the modified shaped vector, š, is given by š=(0, 1,1,1,1,1,1,0,1,0,1,1,0) and the sets $\mathfrak{B}_š^3$ has a unique codeword b=(0,1,1,1,1,1,1,0,0,0,1,1,0). In this case the size of the set of possible code words, $|\mathfrak{B}_š^j|$, equals 1 (i.e. $|\mathfrak{B}_š^j|$=1). Consequently, the LLR value for the index j=3 of the shaped data vector, ŝ, is given by: L(3)=$L_{ch}$(3)+log(8).

FIG. 9 shows a graphical representation of determining an LLR value for an eighth index of the exemplary data vector according to an embodiment. FIG. 9 shows the hard decision estimate of the shaped data vector, ŝ. For j=8, the modified shaped vector, š, is defined to be identical to ŝ expect at the $8^{th}$ position where the data value is logically inverted. Consequently the modified shaped vector, š, has a data value of '1' at j=8 (as opposed to the hard decision estimate of the shaped data vector, ŝ, which has a data value of '0' at j=8).

The set of possible codewords whose shaped vector is given by š is denoted by $\mathfrak{B}_š^8$ (when j=8). As shown in FIG. 9, there are five possible codewords whose shaped vector is denoted by the modified shaped vector, š. As a result the size of the set of possible code words, $|\mathfrak{B}_š^j|$, equals 5 (i.e. $|\mathfrak{B}_š^8|$=5). Consequently, the LLR value for the index j=8 of the shaped data vector, ŝ, is given by:

$$L(8) = L_{ch}(8) + \log\left(\frac{8}{5}\right).$$

For j=9, š=(0,1,0,1,1,1,1,0,0,0,1,1,0) which is not a valid codeword ($\mathfrak{B}_š^9$=∅) and the LLR is approximated as:

$$L(9) = -L_{max}$$

For j=10, š=(0,1,0,1,1,1,1,0,1,1,1,1,0) and the set $\mathfrak{B}_š^{10}$ has four codewords, thus:

$$L(10) = L_{ch}(10) + \log\left(\frac{8}{4}\right)$$

Finally, for j=13, š=(0,1,0,1,1,1,1,0,1,0,1,1,1) and $\mathfrak{B}_š^{13}$ has twelve codewords and one has:

$$L(13) = L_{ch}(13) + \log\left(\frac{8}{12}\right)$$

Consequently, the LLR values for the shaped data vector, ŝ are: ($L_{ch}$(1)+log(8), −$L_{max}$, $L_{ch}$(3)+log(8), −log(3), −log(3), −log(3), −log(3)

$$L_{ch}(8) + \log\left(\frac{8}{5}\right),$$

−$L_{max}$, $L_{ch}$(10)+log(2), 0, 0, $$L_{ch}(13) + \log\left(\frac{2}{3}\right)).$$

These values are then provided to an Error Correcting Code (ECC) soft decoder, where the LLR's are used to decode the codeword and determine the original input data x.

In an embodiment, the LLR values for all bits that do not belong to the set of possible flipped bits (i.e. when $j \notin \hat{S}$) are set equal to the channel LLR, $L_{ch}$, when the device is at an early age. In this case the LLR values for the shaped data vector, ŝ, become: $(L_{ch}(1), -L_{max}, L_{ch}(3), -\log(3), -\log(3), -\log(3), -\log(3), L_{ch}(8), -L_{max}, L_{ch}(10), 0, 0, L_{ch}(13))$.

The above-described endurance modulation/de-modulation scheme uses the Error Correcting Code (ECC) to "correct" the errors that are introduced through bit-flipping the input data in order to reduce the number of high-charge storage states being used.

Consequently, the complexity associated with implementing the above-described endurance modulation/demodulation scheme is negligible and the scheme causes no performance degradation as long as only a few channel errors occur (i.e. it is still within the limit of the Error Correcting Code (ECC) to correct the errors introduced by bit-flipping input data and the reading errors introduced by the channel).

As the device ages, the Error Correcting Code (ECC) may fail to correct the channel errors and correct the deliberate bit flipping in order to retrieve the original data, hence before reaching a certain raw bit-error rate (RBER) threshold, the memory controller must disable the endurance modulation described herein and operate in normal mode.

Figure 10:
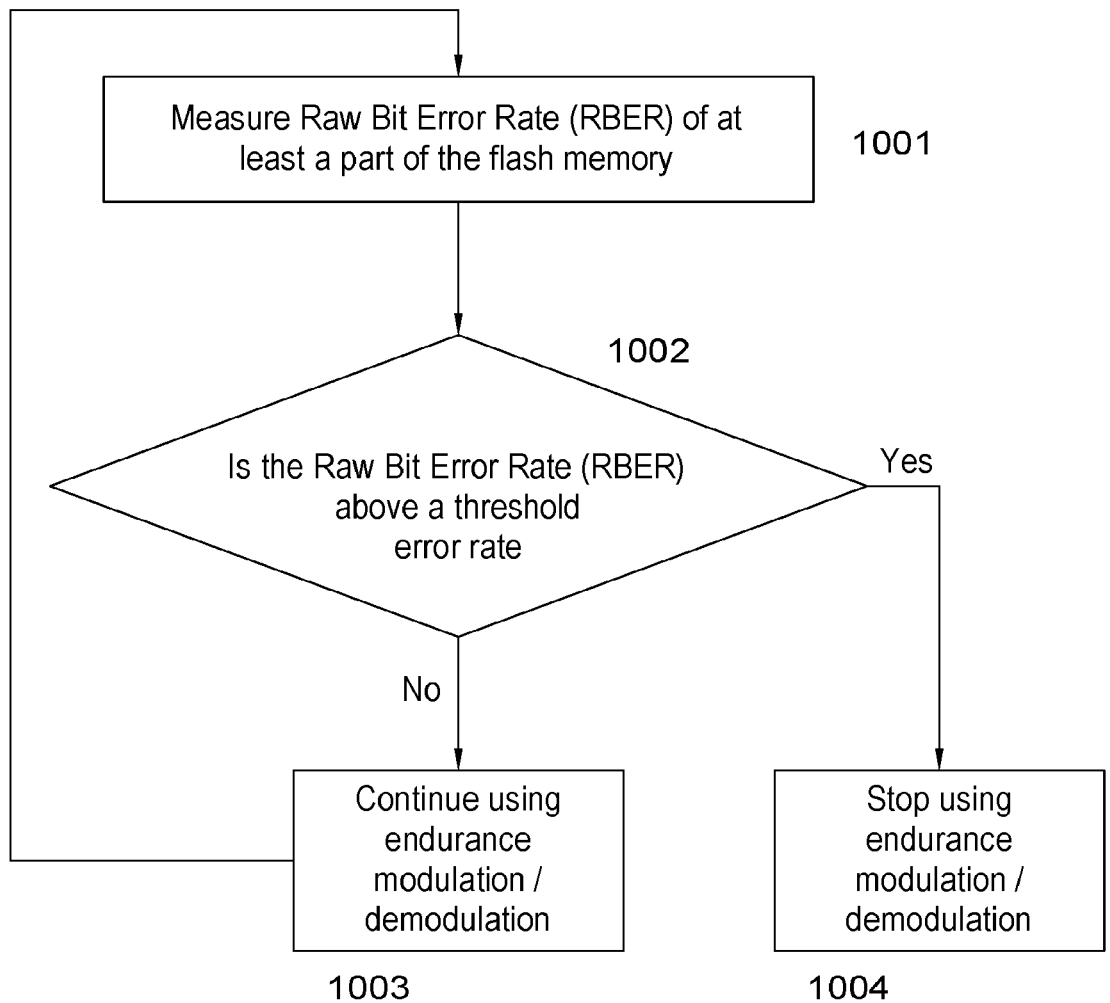
FIG. 10 shows a method of determining when to use endurance modulation according to an embodiment.

FIG. 10 shows a method of determining when to use endurance modulation according to an embodiment. In step 1001 the method measures the Raw Bit Error Rate (RBER) of the flash memory. In an embodiment step 1001 comprises measuring the Raw Bit Error Rate (RBER) associated with a part of the flash memory (e.g. a subset of the flash memory cells).

In step 1002 the method compares the measured Raw Bit Error Rate (RBER) to a predetermined threshold error rate. If it is determined in step 1002 that the Raw Bit Error Rate (RBER) is below the predetermined threshold error rate then the endurance modulation/demodulation continues to be applied to the input data in step 1003.

If in step 1002 it is determined that the Raw Bit Error Rate (RBER) is greater than the predetermined threshold error rate then endurance modulation/demodulation is stopped and the controller reverts to normal mode in step 1004 (i.e. writing the input data to the flash memory without data shaping, and reading data from the flash memory without using the demodulation method shown in FIGS. 5 and 6). Stopping the use of endurance modulation/demodulation when the Raw Bit Error Rate (RBER) is greater than the predetermined threshold error rate avoids introducing any further performance degradation.

In an embodiment the methods shown in FIGS. 4A, 5, 6 and 10 are implemented as computer readable instruction stored in the memory 160. The memory 160 stores the shaping parameter, $n_s$, and is obtained by the processor 150 whenever executing the computer-readable instruction associated the endurance modulation method of FIG. 4A and the endurance demodulation method of FIGS. 5 and 6.

If the method endurance modulation described above is applied over the whole of the codeword, a single channel error (i.e. an error that is not introduced by bit-flipping) can incur many errors in the subsequent bits. In an embodiment, the methods described above are independently applied to parts of the codeword (i.e. a codeword is divided into a plurality of parts, with the methods described herein being independently applied to each part). In this way, the effect of error propagation is limited.

The endurance modulation scheme presented above does not flip all the bits with equal probability. Some bits may not be flipped at all (e.g., at least the first $n_s-1$ bits of each chunk, where $n_s$ is the shaping parameter). Consequently, there is a variable wear out rate across the different cells in the flash memory. In an embodiment, an interleaver is used to level the wear out rate amongst the plurality of cells in the flash memory.

Figure 11A:
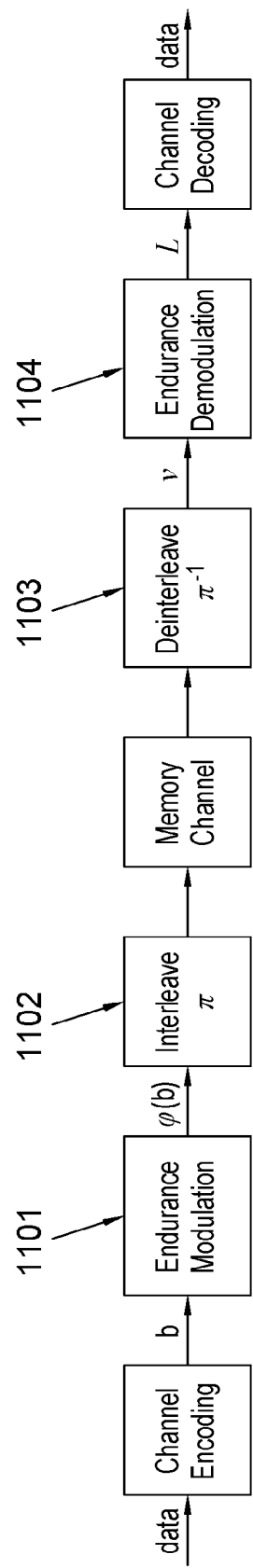
FIG. 11A shows a system overview of writing and reading data in a flash memory according to a first embodiment.

FIG. 11A shows a system overview of writing and reading data in a flash memory according to a first embodiment. In order to flip the bits with equal probability an interleaver 1102 is applied after endurance modulation 1101 and prior to mapping the modulated data into threshold voltages. At the reading side, a deinterleaver 1103 is applied before applying endurance demodulation 1104.

In an embodiment the interleaver comprises a circular shift register where the number of data advance/clocking cycles applied to the circular shift register once the input data has been loaded into the shift register is incremented by one each time data is written to the flash memory. In this embodiment, a similar structure is also present in the deinterleaver. In this way all of the flash memory cells will experience substantially the same wear out on average and only the number of data advance/clocking cycles for the circular shift needs to be stored, optionally in memory 160, for the purpose of interleaving and deinterleaving.

Figure 11B:
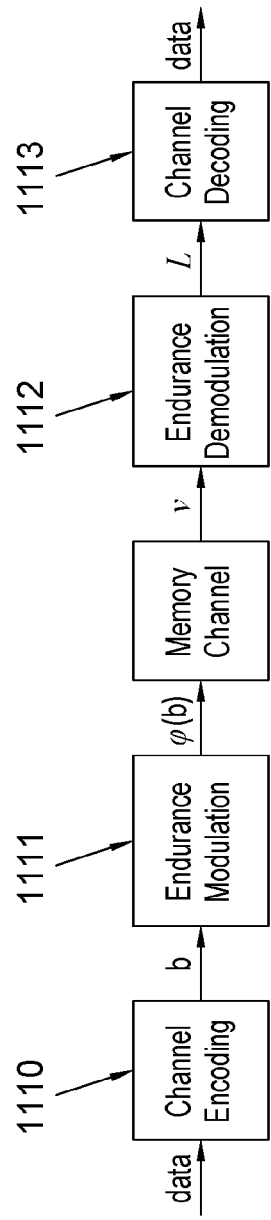
FIG. 11B shows a system overview of writing and reading data in a flash memory according to a second embodiment.

FIG. 11B shows a system overview of writing and reading data in a flash memory according to a second embodiment. A full description of an embodiment of the system will now be described with reference to the computing device and a non-volatile flash storage memory shown in FIG. 1 and to the methods shown in FIGS. 4A, 5 and 6.

To begin with, the computing device 100 transmits original input data (i.e. a plurality of bits) to the non-volatile flash storage memory 110 for storage. The data is subsequently received by the control unit 140 of the memory controller 120. The control unit 140 subsequently applies channel encoding 1110 to the data, thereby generating a stream of bits, b, encoded using an error correcting code. The control unit 140 subsequently applies endurance modulation 1111 to at least a part of the encoded data. More specifically, the processor 150 accesses the memory 160 and executes computer-readable instructions that implement the method as described in FIG. 4A. In order to perform the method of endurance modulation shown in FIG. 4A, the processor 150 also accesses the memory 160 in order to retrieve the predetermined shaping parameter, $n_s$. Following endurance modulation the processor 150 writes the shaped data, $\phi(b)$, to a plurality of memory cells in the non-volatile flash memory 130.

When attempting to access the stored input data the computing device 100 transmits a request for the input data to the flash storage memory 110. This request is received by control unit 140 in the memory controller 120. The processor 150 of the control unit 140 performs endurance demodulation 1112 and channel decoding 1113 by retrieving and executing computer instructions from the memory 160 that implement the method of FIG. 5 and optionally, FIG. 6. In order to carry out the method of FIG. 5, the processor 150 also retrieves the predetermined shaping parameter, $n_s$, from the memory 160. After executing the method of FIG. 5, the processor 150 transmits the recovered data to the computing device 100.

Advantageously, the methods disclosed herein can be executed by the controller using the current hardware architecture of the NAND flash system. No Look Up Table (LUT) is required for storing predetermined shaped vectors, hence the added computational complexity of the methods disclosed herein are negligible. The endurance gain achieved by the modulation/demodulation scheme presented herein depends of the correction capabilities of the employed Forward Error Correction (FEC) (e.g. the type of Error Correction Code (ECC) being used). In the case where the Forward Error Correction (FEC) comprises an Error Correction Code (ECC), the stronger the code, the higher the endurance gain.

The endurance modulation/demodulation scheme disclosed herein was tested on a Single Level Cell (SLC) flash memory where:
1. The threshold voltages of the Single Level Cell (SLC) were 1.1V and 3.05V.
2. Amplitude-shift keying (ASK) programming was used to program the flash memory cells.
3. ISPP increment/step size is fixed to 0.6 V.
4. The cost vector is set to $c_0=0$ (erased) and $c_1=1$ (programmed)
5. The Error Correction Code (ECC) is a regular Low-Density Parity-Check (LDPC) code and is decoded with an optimal soft detector.

The achieved endurance gain for a (17920, 16384) LDPC code (i.e. where the encoded block size comprises 17920 symbols, formed from 16384 data bits) is ~1.033 error free (over $10^5$ packets) up to 30000 Program/Erase (P/E) cycles (resulting in ~$1.85 \times 10^{-4}$ RBER). Using an Error Correcting Code (ECC) with a larger proportion of parity bits enables a higher endurance gain. For example, using an (18432, 16384) LDPC code enables an endurance gain of ~1.057 error free (over $10^5$ packets) up to 20K P/E cycles (~$5.4 \times 10^{-5}$ RBER).

As discussed above, the method of endurance modulation/de-modulation can also used with denser cells (e.g., MLC (2 bits/cell), TLC (3 bits/cell) and QLC (4 bits/cell)) by separately modulating data that is written to each logical page. Separately encoding the data written to each logical page suggests that each logical page is treated independently. However, for the avoidance of doubt, it is noted that the properties of the endurance modulation applied to the first logical page, and the properties of the endurance modulation applied to the second logical page can be considered together when attempting to maximise the endurance gain.

Consider a Multi-Level Cell (2 bits/cell) where the storage states are associated with the Gray Labelling {11, 10, 00, 01}. Let $\alpha$ denote the probability of the lower-page bit being a '1', and let $\beta$ denote the probability of the upper-page bit being a '1'. In this case the probability of a given cell being programmed to each storage state is: $\alpha\beta$, $\alpha(1-\beta)$, $(1-\alpha)(1-\beta)$, $(1-\alpha)\beta$ respectively. Here, the values of $\alpha$ and $\beta$, which are related to the endurance modulation scheme applied to each logical page, can be chosen jointly to maximise the endurance gain across the flash memory.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A method for storing input data in a flash memory, the method comprising:
generating a codeword by encoding the input data with an error correcting code;
generating a shaped codeword by applying a shaping function to at least a part of the codeword, the shaping function including:
inverting every n-th occurrence of a bit associated with a high-charge storage state in the part of the codeword;
writing the shaped codeword to the flash memory;
generating an estimated shaped codeword by reading the flash memory;
generating soft decision information for the estimated shaped codeword; and
retrieving the input data by decoding the soft decision information using an error correcting code soft decoder.

2. The method according to claim 1, wherein generating the estimated shaped codeword includes reading the flash memory using hard decision decoding.

3. The method according to claim 2, wherein generating soft decision information for the estimated shaped codeword includes:
generating a Log-Likelihood Ratio (LLR) value for a first bit in the estimated shaped codeword.

4. The method according to claim 3, wherein generating the Log-Likelihood Ratio (LLR) value for the first bit in the estimated shaped codeword includes:
determining a first set of codewords that, when shaped by the shaping function, generate a shaped vector equal to the estimated shaped codeword; and
determining the Log-Likelihood Ratio (LLR) value for the first bit based on a number of codewords in the first set of codewords.

5. The method according to claim 4, wherein generating the Log-Likelihood Ratio (LLR) value for the first bit in the estimated shaped codeword includes:
setting a modified codeword equal to the estimated shaped codeword with the first bit being logically inverted;
determining a second set of codewords that, when shaped by the shaping function, generate the modified codeword; and
determining the Log-Likelihood Ratio (LLR) value for the first bit based on: the number of codewords in the first set of codewords, divided by, a number of codewords in the second set of codewords.

6. The method according to claim 5, wherein determining the Log-Likelihood Ratio (LLR) value for the first bit includes:
summing a channel Log-Likelihood Ratio (LLR) associated with the first bit and a logarithm of the number of codewords in the first set of codewords, divided by, the number of codewords in the second set of codewords.

7. The method according to claim 5, further comprising:
determining whether the modified codeword represents an invalid codeword; and
in response to determining that the modified codeword does represent an invalid codeword,
setting the Log-Likelihood Ratio (LLR) value for the first bit equal to a maximum Log-Likelihood Ratio (LLR) value.

8. The method according to claim 3, wherein generating the Log-Likelihood Ratio (LLR) value for the first bit in the estimated shaped codeword includes:
setting the Log-Likelihood Ratio (LLR) value equal to a channel Log-Likelihood Ratio (LLR) associated with the first bit in response to determining that the flash memory is at an early stage of its lifespan.

9. The method according to claim 3, wherein generating the Log-Likelihood Ratio (LLR) value for the first bit in the estimated shaped codeword includes:
identifying a set of indices in the estimated shaped codeword that could have been shaped by the shaping function; and
in response to determining that the set of indices comprises the index of the first bit,
setting the Log-Likelihood Ratio (LLR) values for the first bit based on a number of indices in the set of indices.

10. The method according to claim 1, wherein generating the shaped codeword and writing the shaped codeword to the flash memory is performed in response to determining that a Raw Bit Error rate of the flash memory is less than a predetermined threshold.

11. A non-transitory computer readable storage medium comprising:
computer program instructions that, when executed by a processor, cause the processor to perform the method of claim 1.

12. An apparatus fir storing input data in a flash memory, the apparatus being configured to:
generate a codeword by encoding the input data with an error correcting code;
generate a shaped codeword by applying a shaping function to at least a part of the codeword, the shaping function including:
inverting every n-th occurrence of a bit associated with a high-charge storage state in the part of the codeword;
write the shaped codeword to the flash memory;
generate an estimated shaped codeword by reading the flash memory;
generate soft decision information for the estimated shaped codeword; and
retrieve the input data by decoding the soft decision information using an error correcting code soft decoder.

13. The apparatus according to claim 12, wherein the apparatus is further configured to:
read the flash memory using hard decision decoding when generating the estimated shaped codeword.

14. The apparatus according to claim 13, wherein the apparatus is further configured to:
generate a Log-Likelihood Ratio (LLR) value for a first bit in the estimated shaped codeword when generating soft decision information for the estimated shaped codeword.

15. The apparatus according to claim 14, wherein the apparatus is further configured to:
determine a first set of codewords that, when shaped by the shaping function, generate a shaped vector equal to the estimated shaped codeword; and
determine the Log-Likelihood Ratio (LLR) value for the first bit based on a number of codewords in the first set of codewords;
when generating the Log-Likelihood Ratio (LLR) value for the first bit in the estimated shaped codeword.

16. The apparatus according to claim 15, wherein the apparatus is further configured to:
set a modified codeword equal to the estimated shaped codeword with the first bit being logically inverted;
determine a second set of codewords that, when shaped by the shaping function, generate the modified codeword; and
determine the Log-Likelihood Ratio (LLR) value for the first bit based on: the number of codewords in the first set of codewords, divided by, a number of codewords in the second set of codewords; when
generating the Log-Likelihood Ratio (LLR) value for the first bit in the estimated shaped codeword.

17. The apparatus according to claim 16, wherein the apparatus is further configured to:
sum a channel Log-Likelihood Ratio (LLR) associated with the first bit and a logarithm of the number of codewords in the first set of codewords, divided by, the number of codewords in the second set of codewords; when determining the Log-Likelihood Ratio (LLR) value for the first bit.

18. The apparatus according to claim 16, wherein the apparatus is further configured to:
determine whether the modified codeword represents an invalid codeword; and
in response to determining that the modified codeword does represent an invalid codeword,
set the Log-Likelihood Ratio (LLR) value for the first bit equal to a maximum Log-Likelihood Ratio (LLR) value.

19. The apparatus according to claim 14, wherein the apparatus is further configured to:
identify a set of indices in the estimated shaped codeword that could have been shaped by the shaping function; and
in response to determining that the set of indices comprises the index of the first bit,
set the Log-Likelihood Ratio (LLR) values for the first bit based on a number of indices in the set of indices;
when generating the Log-Likelihood Ratio (LLR) value for the first bit in the estimated shaped codeword.

20. A flash memory comprising:
a plurality of flash memory cells; and
the apparatus for storing input data according to claim 12.

* * * * *